US00RE40436E

(19) United States
(12) Reissued Patent
Kothari et al.

(10) Patent Number: US RE40,436 E
(45) Date of Reissued Patent: Jul. 15, 2008

(54) HERMETIC SEAL AND METHOD TO CREATE THE SAME

(75) Inventors: Manish Kothari, Cupertino, CA (US); Clarence Chui, San Jose, CA (US)

(73) Assignee: IDC, LLC, San Francisco, CA (US)

(21) Appl. No.: 11/176,878

(22) Filed: Jul. 7, 2005

Related U.S. Patent Documents

Reissue of:
(64) Patent No.: 6,589,625
Issued: Jul. 8, 2003
Appl. No.: 09/921,196
Filed: Aug. 1, 2001

(51) Int. Cl.
*B32B 3/10* (2006.01)

(52) U.S. Cl. ..... 428/46; 428/49; 428/76; 428/192; 428/355 R

(58) Field of Classification Search ..... 428/46, 428/49, 76, 192, 355 R; 96/154
See application file for complete search history.

(56) References Cited

U.S. PATENT DOCUMENTS

| | | | | |
|---|---|---|---|---|
| 2,534,846 | A | | 12/1950 | Ambrose et al. |
| 3,439,973 | A | | 4/1969 | Paul et al. |
| 3,443,854 | A | | 5/1969 | Weiss |
| 3,653,741 | A | | 4/1972 | Marks |
| 3,656,836 | A | | 4/1972 | de Cremoux et al. |
| 3,704,806 | A | * | 12/1972 | Plachenov et al. ..... 206/204 |
| 3,813,265 | A | | 5/1974 | Marks |
| 3,900,440 | A | * | 8/1975 | Ohara et al. ..... 523/410 |
| 3,955,880 | A | | 5/1976 | Lierke |
| 4,036,360 | A | * | 7/1977 | Deffeyes ..... 206/204 |
| 4,074,480 | A | * | 2/1978 | Burton ..... 52/127.1 |
| 4,099,854 | A | | 7/1978 | Decker et al. |
| 4,228,437 | A | | 10/1980 | Shelton |

(Continued)

FOREIGN PATENT DOCUMENTS

| | | | |
|---|---|---|---|
| EP | 0 667 548 | | 8/1995 |
| JP | 02-068513 | | 3/1990 |
| JP | 03-199920 | | 8/1991 |
| WO | WO 97/17628 | | 5/1997 |
| WO | WO 95/30924 | | 11/1997 |
| WO | WO 99/52006 | A3 | 10/1999 |
| WO | WO 99/52006 | A2 | 10/1999 |
| WO | WO 03/007049 | A1 | 1/2003 |

OTHER PUBLICATIONS

Office Action mailed Sep. 24, 2002 in U.S. App. No. 09/921,196.
Akasaka, "Three–Dimensional IC Trends," Proceedings of IEEE, vol. 74, No. 12, pp. 1703–1714 (Dec. 1986).
Aratani et al., "Process and Design Considerations for Surface Micromachined Beams for a Tuneable Interferometer Array in Silicon," Proc. IEEE Microelectromechanical Workshop, Fort Lauderdale, FL, pp. 230–235 (Feb. 1993).
Aratani et al., "Surface Micromachined Tuneable Interferometer Array," Sensors and Actuators, pp. 17–23 (1994).
Conner, "Hybrid Color Display Using Optical Interference Filter Array," SID Digest, pp. 577–580 (1993).
Goossen et al., "Possible Display Applications of the Silicon Mechinical Anti–Reflection Switch, " Society for Information Display (1994).

(Continued)

*Primary Examiner*—Cathy F. Lam
(74) *Attorney, Agent, or Firm*—Knobbe Martens Olson & Bear LLP

(57) ABSTRACT

An electronic display screen is created by processing a mirror on a substrate glass. A back plate glass is then placed on top of the substrate glass and sealed to the back plate glass. A hermetic seal that includes an adhesive mixed with zeolites is disclosed. The hermetic seal can seal the back plate glass with the substrate glass. The application of the hermetic seal is not limited to the electronic display screen. Rather, the hermetic seal can be used to seal a variety of surfaces including metals, polymers, plastics, alloys, ceramics and the like.

26 Claims, 1 Drawing Sheet

U.S. PATENT DOCUMENTS

| | | | | | |
|---|---|---|---|---|---|
| 4,377,324 | A | | 3/1983 | Durand et al. | |
| 4,389,096 | A | | 6/1983 | Hori et al. | |
| 4,403,248 | A | | 9/1983 | Te Velde | |
| 4,431,691 | A | * | 2/1984 | Greenlee | 428/34 |
| 4,441,791 | A | | 4/1984 | Hornbeck | |
| 4,445,050 | A | | 4/1984 | Marks | |
| 4,482,213 | A | | 11/1984 | Piliavin et al. | |
| 4,500,171 | A | | 2/1985 | Penz et al. | |
| 4,519,676 | A | | 5/1985 | te Velde | |
| 4,531,126 | A | | 7/1985 | Sadones | |
| 4,552,806 | A | * | 11/1985 | Hayashi et al. | 428/312.6 |
| 4,566,935 | A | | 1/1986 | Hornbeck | |
| 4,571,603 | A | | 2/1986 | Hornbeck et al. | |
| 4,596,992 | A | | 6/1986 | Hornbeck | |
| 4,615,595 | A | | 10/1986 | Hornbeck | |
| 4,662,746 | A | | 5/1987 | Hornbeck | |
| 4,663,083 | A | | 5/1987 | Marks | |
| 4,681,403 | A | | 7/1987 | te Velde et al. | |
| 4,710,732 | A | | 12/1987 | Hornbeck | |
| 4,748,366 | A | | 5/1988 | Taylor | |
| 4,786,128 | A | | 11/1988 | Birnbach | |
| 4,790,635 | A | | 12/1988 | Apsley | |
| 4,856,863 | A | | 8/1989 | Sampsell et al. | |
| 4,950,344 | A | * | 8/1990 | Glover et al. | 156/109 |
| 4,954,789 | A | | 9/1990 | Sampsell | |
| 4,956,619 | A | | 9/1990 | Hornbeck | |
| 4,977,009 | A | * | 12/1990 | Anderson et al. | 428/76 |
| 4,982,184 | A | | 1/1991 | Kirkwood | |
| 5,018,256 | A | | 5/1991 | Hornbeck | |
| 5,018,258 | A | | 5/1991 | Hornbeck | |
| 5,022,745 | A | | 6/1991 | Zayhowski et al. | |
| 5,028,939 | A | | 7/1991 | Hornbeck et al. | |
| 5,037,173 | A | | 8/1991 | Sampsell et al. | |
| 5,044,736 | A | | 9/1991 | Jaskie et al. | |
| 5,061,049 | A | | 10/1991 | Hornbeck | |
| 5,075,796 | A | | 12/1991 | Schildkraut et al. | |
| 5,078,479 | A | | 1/1992 | Vuilleumier | |
| 5,079,544 | A | | 1/1992 | DeMond et al. | |
| 5,083,857 | A | | 1/1992 | Hornbeck | |
| 5,095,375 | A | * | 3/1992 | Bolt | 359/1 |
| 5,096,279 | A | | 3/1992 | Hornbeck et al. | |
| 5,099,353 | A | | 3/1992 | Hornbeck | |
| 5,124,834 | A | | 6/1992 | Cusano et al. | |
| 5,142,405 | A | | 8/1992 | Hornbeck | |
| 5,153,771 | A | | 10/1992 | Link et al. | |
| 5,162,787 | A | | 11/1992 | Thompson et al. | |
| 5,168,406 | A | | 12/1992 | Nelson | |
| 5,170,156 | A | | 12/1992 | DeMond et al. | |
| 5,172,262 | A | | 12/1992 | Hornbeck | |
| 5,179,274 | A | | 1/1993 | Sampsell | |
| 5,192,395 | A | | 3/1993 | Boysel et al. | |
| 5,192,946 | A | | 3/1993 | Thompson et al. | |
| 5,206,629 | A | | 4/1993 | DeMond et al. | |
| 5,212,582 | A | | 5/1993 | Nelson | |
| 5,214,419 | A | | 5/1993 | DeMond et al. | |
| 5,214,420 | A | | 5/1993 | Thompson et al. | |
| 5,216,537 | A | | 6/1993 | Hornbeck | |
| 5,226,099 | A | | 7/1993 | Mignardi et al. | |
| 5,231,532 | A | | 7/1993 | Magel et al. | |
| 5,233,385 | A | | 8/1993 | Sampsell | |
| 5,233,456 | A | | 8/1993 | Nelson | |
| 5,233,459 | A | | 8/1993 | Bozler et al. | |
| 5,244,707 | A | * | 9/1993 | Shores | 428/76 |
| 5,254,980 | A | | 10/1993 | Hendrix et al. | |
| 5,272,473 | A | | 12/1993 | Thompson et al. | |
| 5,278,652 | A | | 1/1994 | Urbanus et al. | |
| 5,280,277 | A | | 1/1994 | Hornbeck | |
| 5,287,096 | A | | 2/1994 | Thompson et al. | |
| 5,296,950 | A | | 3/1994 | Lin et al. | |
| 5,304,419 | A | * | 4/1994 | Shores | 428/355 R |
| 5,305,640 | A | | 4/1994 | Boysel et al. | |
| 5,311,360 | A | | 5/1994 | Bloom et al. | |
| 5,312,513 | A | | 5/1994 | Florence et al. | |
| 5,323,002 | A | | 6/1994 | Sampsell et al. | |
| 5,325,116 | A | | 6/1994 | Sampsell | |
| 5,327,286 | A | | 7/1994 | Sampsell et al. | |
| 5,331,454 | A | | 7/1994 | Hornbeck | |
| 5,339,116 | A | | 8/1994 | Urbanus et al. | |
| 5,365,283 | A | | 11/1994 | Doherty et al. | |
| 5,381,253 | A | | 1/1995 | Sharp et al. | |
| 5,401,983 | A | | 3/1995 | Jokerst et al. | |
| 5,411,769 | A | | 5/1995 | Hornbeck | |
| 5,444,566 | A | | 8/1995 | Gale et al. | |
| 5,446,479 | A | | 8/1995 | Thompson et al. | |
| 5,448,314 | A | | 9/1995 | Heimbuch et al. | |
| 5,452,024 | A | | 9/1995 | Sampsell | |
| 5,454,906 | A | | 10/1995 | Baker et al. | |
| 5,457,493 | A | | 10/1995 | Leddy et al. | |
| 5,457,566 | A | | 10/1995 | Sampsell et al. | |
| 5,459,602 | A | | 10/1995 | Sampsell | |
| 5,459,610 | A | | 10/1995 | Bloom et al. | |
| 5,461,411 | A | | 10/1995 | Florence et al. | |
| 5,489,952 | A | | 2/1996 | Gove et al. | |
| 5,497,172 | A | | 3/1996 | Doherty et al. | |
| 5,497,197 | A | | 3/1996 | Gove et al. | |
| 5,499,062 | A | | 3/1996 | Urbanus | |
| 5,500,635 | A | | 3/1996 | Mott | |
| 5,500,761 | A | | 3/1996 | Goossen et al. | |
| 5,506,597 | A | | 4/1996 | Thompson et al. | |
| 5,515,076 | A | | 5/1996 | Thompson et al. | |
| 5,517,347 | A | | 5/1996 | Sampsell | |
| 5,523,803 | A | | 6/1996 | Urbanus et al. | |
| 5,526,051 | A | | 6/1996 | Gove et al. | |
| 5,526,172 | A | | 6/1996 | Kanack | |
| 5,526,688 | A | | 6/1996 | Boysel et al. | |
| 5,535,047 | A | | 7/1996 | Hornbeck | |
| 5,547,823 | A | * | 8/1996 | Murasawa et al. | 430/531 |
| 5,548,301 | A | | 8/1996 | Kornher et al. | |
| 5,550,373 | A | | 8/1996 | Cole et al. | |
| 5,551,293 | A | | 9/1996 | Boysel et al. | |
| 5,552,924 | A | | 9/1996 | Tregilgas | |
| 5,553,440 | A | * | 9/1996 | Bulger et al. | 52/786.13 |
| 5,559,358 | A | | 9/1996 | Burns et al. | |
| 5,563,398 | A | | 10/1996 | Sampsell | |
| 5,567,334 | A | | 10/1996 | Baker et al. | |
| 5,570,135 | A | | 10/1996 | Gove et al. | |
| 5,579,149 | A | | 11/1996 | Moret et al. | |
| 5,581,272 | A | | 12/1996 | Conner et al. | |
| 5,583,688 | A | | 12/1996 | Hornbeck | |
| 5,589,852 | A | | 12/1996 | Thompson et al. | |
| 5,591,379 | A | * | 1/1997 | Shores | 252/194 |
| 5,597,736 | A | | 1/1997 | Sampsell | |
| 5,600,383 | A | | 2/1997 | Hornbeck | |
| 5,602,671 | A | | 2/1997 | Hornbeck | |
| 5,606,441 | A | | 2/1997 | Florence et al. | |
| 5,608,468 | A | | 3/1997 | Gove et al. | |
| 5,610,438 | A | | 3/1997 | Wallace et al. | |
| 5,610,624 | A | | 3/1997 | Bhuva | |
| 5,610,625 | A | | 3/1997 | Sampsell | |
| 5,619,059 | A | | 4/1997 | Li et al. | |
| 5,619,365 | A | | 4/1997 | Rhoades et al. | |
| 5,619,366 | A | | 4/1997 | Rhoades et al. | |
| 5,636,052 | A | | 6/1997 | Arney et al. | |
| 5,646,768 | A | | 7/1997 | Kaeiyama | |
| 5,650,881 | A | | 7/1997 | Hornbeck | |
| 5,654,741 | A | | 8/1997 | Sampsell et al. | |
| 5,657,099 | A | | 8/1997 | Doherty et al. | |
| 5,659,374 | A | | 8/1997 | Gale, Jr. et al. | |
| 5,665,997 | A | | 9/1997 | Weaver et al. | |
| 5,703,710 | A | | 12/1997 | Brinkman et al. | |
| 5,710,656 | A | | 1/1998 | Goossen | |

| | | | | | |
|---|---|---|---|---|---|
| 5,739,945 | A | | 4/1998 | Tayebati | |
| 5,745,193 | A | | 4/1998 | Urbanus et al. | |
| 5,745,281 | A | | 4/1998 | Yi et al. | |
| 5,771,116 | A | | 6/1998 | Miller et al. | |
| 5,784,190 | A | | 7/1998 | Worley | |
| 5,784,212 | A | | 7/1998 | Hornbeck | |
| 5,815,141 | A | * | 9/1998 | Phares | 345/173 |
| 5,818,095 | A | | 10/1998 | Sampsell | |
| 5,825,528 | A | | 10/1998 | Goosen | |
| 5,835,255 | A | * | 11/1998 | Miles | 359/291 |
| 5,842,088 | A | | 11/1998 | Thompson | |
| 5,853,662 | A | * | 12/1998 | Watanabe | 422/40 |
| 5,912,758 | A | | 6/1999 | Knipe et al. | |
| 5,939,785 | A | | 8/1999 | Klonis et al. | |
| 5,986,796 | A | * | 11/1999 | Miles | 359/260 |
| 6,028,690 | A | | 2/2000 | Carter et al. | |
| 6,038,056 | A | | 3/2000 | Florence et al. | |
| 6,040,937 | A | * | 3/2000 | Miles | 359/291 |
| 6,049,317 | A | | 4/2000 | Thompson | |
| 6,055,090 | A | * | 4/2000 | Miles | 359/291 |
| 6,061,075 | A | | 5/2000 | Nelson et al. | |
| 6,099,132 | A | | 8/2000 | Kaeriyama | |
| 6,113,239 | A | | 9/2000 | Sampsell et al. | |
| 6,147,790 | A | | 11/2000 | Meier et al. | |
| 6,160,833 | A | | 12/2000 | Floyd et al. | |
| 6,180,428 | B1 | | 1/2001 | Peeters et al. | |
| 6,201,633 | B1 | | 3/2001 | Peeters et al. | |
| 6,232,936 | B1 | | 5/2001 | Gove et al. | |
| 6,238,755 | B1 | * | 5/2001 | Harvey et al. | 428/334 |
| 6,282,010 | B1 | | 8/2001 | Sulzbach et al. | |
| 6,295,154 | B1 | | 9/2001 | Laor et al. | |
| 6,323,982 | B1 | | 11/2001 | Hornbeck | |
| 6,355,328 | B1 | * | 3/2002 | Baratuci et al. | 428/68 |
| 6,447,126 | B1 | | 9/2002 | Hornbeck | |
| 6,455,927 | B1 | | 9/2002 | Glenn et al. | |
| 6,465,355 | B1 | * | 10/2002 | Horsley | |
| 6,466,358 | B2 | * | 10/2002 | Tew | |
| 6,473,274 | B1 | * | 10/2002 | Maimone et al. | |
| 6,480,177 | B2 | * | 11/2002 | Doherty et al. | |
| 6,496,122 | B2 | * | 12/2002 | Sampsell | |
| 6,545,335 | B1 | * | 4/2003 | Chua et al. | |
| 6,548,908 | B2 | * | 4/2003 | Chua et al. | |
| 6,549,338 | B1 | * | 4/2003 | Wolverton et al. | |
| 6,552,840 | B2 | * | 4/2003 | Knipe | |
| 6,582,789 | B1 | * | 6/2003 | Sumi | 428/40.1 |
| 6,600,201 | B2 | * | 7/2003 | Hartwell et al. | |
| 6,606,175 | B1 | * | 8/2003 | Sampsell et al. | |
| 6,625,047 | B2 | * | 9/2003 | Coleman, Jr. | |
| 6,630,786 | B2 | * | 10/2003 | Cummings et al. | |
| 6,643,069 | B2 | * | 11/2003 | Dewald | |
| 6,650,455 | B2 | * | 11/2003 | Miles | |
| 6,674,090 | B1 | * | 1/2004 | Chua et al. | |
| 6,674,562 | B1 | * | 1/2004 | Miles | |
| 6,680,792 | B2 | * | 1/2004 | Miles | |
| 6,709,750 | B1 | * | 3/2004 | Pohlmann et al. | 428/441 |
| 6,710,908 | B2 | * | 3/2004 | Miles et al. | |
| 6,775,174 | B2 | * | 8/2004 | Huffman et al. | |
| 6,778,155 | B2 | * | 8/2004 | Doherty et al. | |
| 6,822,628 | B2 | * | 11/2004 | Dunphy et al. | |
| 6,859,218 | B1 | * | 2/2005 | Luman et al. | |
| 6,862,022 | B2 | | 3/2005 | Slupe | |
| 6,862,029 | B1 | | 3/2005 | D'Souza et al. | |
| 6,867,896 | B2 | | 3/2005 | Miles | |
| 7,012,726 | B1 | | 3/2006 | Miles | |
| 7,012,732 | B2 | | 3/2006 | Miles | |
| 7,042,643 | B2 | | 5/2006 | Miles | |
| 7,119,945 | B2 | | 10/2006 | Kothari et al. | |
| 7,123,216 | B1 | | 10/2006 | Miles | |
| 7,130,104 | B2 | | 10/2006 | Cummings | |
| 7,136,213 | B2 | | 11/2006 | Chui | |
| 7,138,984 | B1 | | 11/2006 | Miles | |
| 7,142,346 | B2 | | 11/2006 | Chui et al. | |
| 2001/0003487 | A1 | | 6/2001 | Miles | |
| 2002/0015215 | A1 | | 2/2002 | Miles | |
| 2002/0056898 | A1 | | 5/2002 | Lopes et al. | |
| 2002/0075555 | A1 | | 6/2002 | Miles | |
| 2002/0126364 | A1 | | 9/2002 | Miles | |
| 2002/0187254 | A1 | | 12/2002 | Ghosh | |
| 2003/0043157 | A1 | * | 3/2003 | Miles | |
| 2003/0072070 | A1 | * | 4/2003 | Miles | |
| 2003/0202266 | A1 | * | 10/2003 | Ring et al. | |
| 2004/0051929 | A1 | * | 3/2004 | Sampsell et al. | |
| 2004/0240032 | A1 | * | 12/2004 | Miles | |
| 2005/0254155 | A1 | | 11/2005 | Plamateer et al. | |
| 2006/0066935 | A1 | | 3/2006 | Cummings et al. | |
| 2007/0097477 | A1 | | 5/2007 | Miles | |

OTHER PUBLICATIONS

Goosen et al., "Silicoon Modulator Based on Mechanically–Active Anti–Reflection Layer with 1Mbit/sec Capability for Fiber–in–the–Loop Applications," IEEE Photonics Technology Letters (Sep. 1994).

Gosch, "West Germany Grabs the Lead in X–Ray Litography," Electronics, pp. 78–80 (Feb. 5, 1987).

Howard et al., "Nanometer–Scale Fabrication Techniques," VLSI Electronics:Microstructure Science, vol. 5, pp. 145–153 and pp. 166–173 (1982).

Jackson, "Classical Electrodynamics," John Wiley & Sons Inc., pp. 568–573.

Jerman et al., "A Miniature Fabry–Perot Interfrometer with a Corrugated Silicon Diaphragm Support," IEEE Electron Devices Society (1988).

Johnson "Optical Scanners," Microwave Scanning Antennas, vol. 1, pp. 251–261 (1964).

"Light over Matter," Circle No. 36 (Jun. 1993).

Miles, "A New Reflective FPD Technology Using Interferometric Modulation," Society for Information Display '97 Digest, Session 7.3.

Newsbreaks, "Quantum–trench devices might operate at terahertz frequencies," Laser Focus World (May 1993).

Oliner et al., "Radiating Elements and Mutual Coupling," Microwave Scanning Antennas, vol. 2, pp. 134–194 (1966).

Raley et al., "A Fabry–Perot Microinterferometer for Visible Wavelenghts," IEEE Solid–State Sensor and Actuator Workshop, Hilton Head, SC (1992).

Sperger et al., "High Performance Patterned All–Dielectric Interference Colour Filter for Display Applications," SID Digest, pp. 81–83 (1994).

Stone, "Radiation and Optics, An Introduction to the Classical Theory," McGraw–Hill, pp. 340–343 (1963).

Walker, et al., "Electron–beam–tunable Interference Filter Spatial Light Modulator," Optics Letters, vol. 13, No. 5, pp. 345–347 (May 1988).

Winton, John M., "A novel way to capture solar energy," Chemical Week, pp. 17–18 (May 15, 1985).

Wu, "Design of a Reflective Color LCD Using Optical Interference Reflectors," ASIA Display '95, pp. 929–931 (Oct. 16, 1995).

* cited by examiner

HERMETIC SEAL AND METHOD TO CREATE THE SAME

Matter enclosed in heavy brackets [ ] appears in the original patent but forms no part of this reissue specification; matter printed in italics indicates the additions made by reissue.

FIELD OF THE INVENTION

The present invention relates to a hermetic seal and methods to create the same. Specifically, a functional hermetic seal is disclosed that includes an adhesive mixed with an active component that can act as an absorbing filter on a molecular level.

BACKGROUND

To create an electronic display screen, a microelectromechanical systems (MEMS) based device such as a mirror is sandwiched between two glass plates: the back plate glass stand the substrate glass. The mirror is typically processed on the substrate glass. The back plate glass is then placed on top of the substrate glass to form the sandwich. The purpose of the back plate glass is to act as a viewing surface and to provide mechanical and environmental protection to the mirror. The sandwich is also referred to as the package.

The MEMS based device that is packaged in this manner is susceptible to problems associated with moisture and other harmful contaminants. The presence of moisture can cause stiction (static friction). The stiction can result because of the physical hydrogen bonding between the two glass surfaces in contact or because of the surface tension forces that result when the moisture between the two glass surfaces undergoes capillary condensation during the actuation of the MEMS based device. The presence of moisture can also cause electrochemical corrosion; for example, if the mirror includes an aluminum mirror.

The presence of harmful contaminants and moisture can pose a danger to the functioning of MEMS based device. For example, chlorine and moisture can combine to form an acidic environment that can be harmful to the MEMS based device. It is important that the package is moisture and contaminant free for the life of the device.

There are various channels by which water vapor or the contaminant can find its way inside the package. The moisture can enter the package from the environment in which the MEMS device is packaged. The moisture can permeate into the package from outside. The contaminant can be formed as a result of the outgassing of package components such as glass and polymers, especially at elevated temperatures.

In the prior art, to prevent the moisture and the contaminant from entering the package, the back plate glass and the substrate glass of the package are sealed to each other by using techniques such as welding and soldering, and by using o-rings. These prior art techniques are lacking in at least two respects. One, welding and soldering materials and o-rings occupy space. Real estate in MEMS based device packages is tight and there is a growing need for smaller form factors. Two, these prior art techniques do not eliminate the moisture and contaminants that are formed inside the package as a result of, for example, outgassing.

A simple technique to effectively seal two surfaces to each other that does not occupy additional real estate is desirable.

BRIEF DESCRIPTION OF THE DRAWING

The present invention is illustrated by way of example and not limitation in the figure of the accompanying drawing, in which.

SUMMARY OF THE INVENTION

Figure 1:
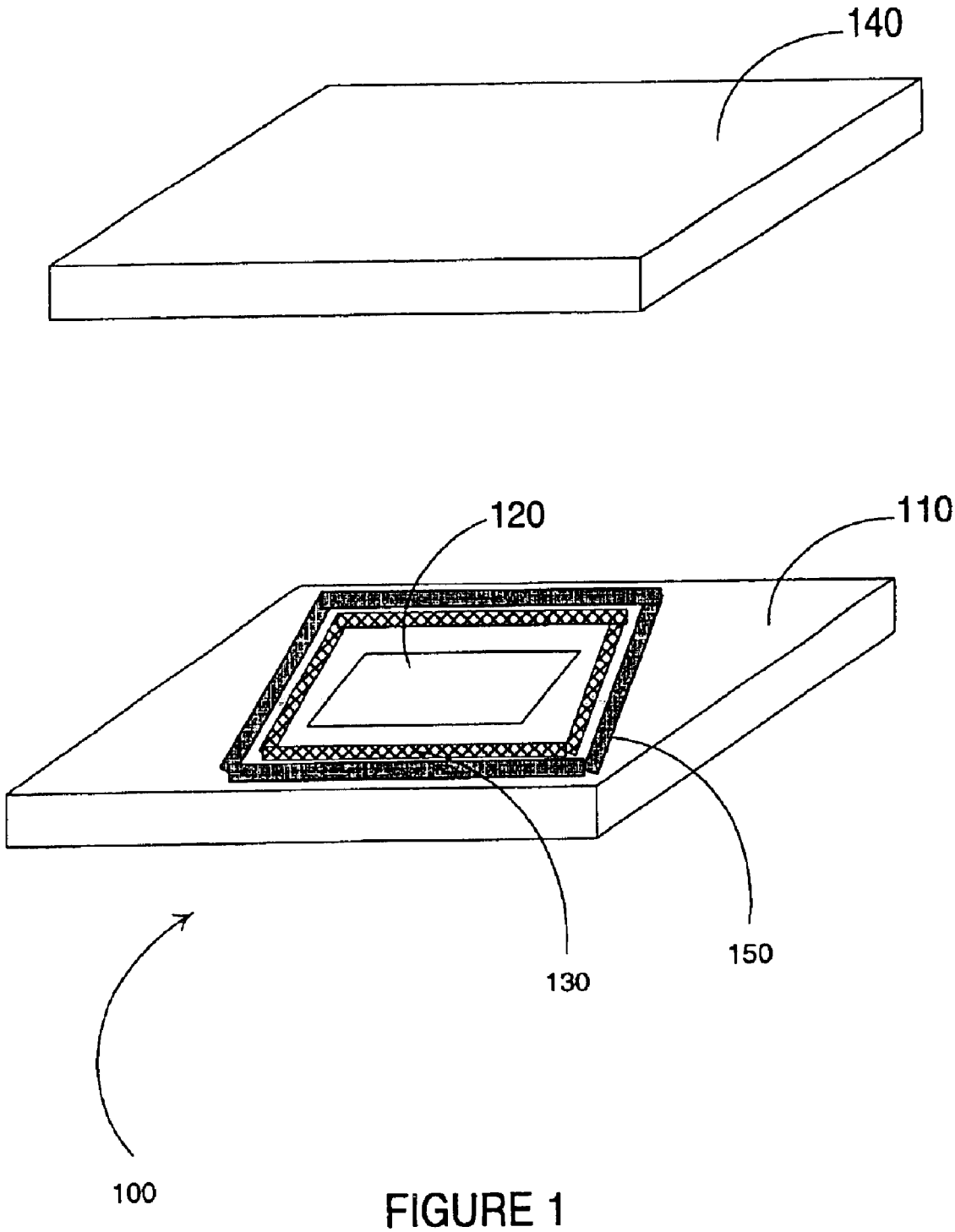
FIG. 1 illustrates an exemplary embodiment of package components that can be sealed with the hermetic seal of the present invention.

The hermetic seal including an adhesive mixed with an active component that can act as an absorbing filter on a molecular level is disclosed. The material can include a zeolite.

Additional features and advantages of the present invention will be apparent from the accompanying drawing and the detailed description that follows.

DETAILED DESCRIPTION

In the following descriptions for the purposes of explanation, numerous details are set forth such as examples of specific materials and methods in order to provide a thorough understanding of the present invention. It will be apparent, however, to one skilled in the art that these specific details are not required in order to practice the present invention. In other instances, well known materials and methods have not been described in detail in order to avoid unnecessarily obscuring the present invention.

In this description, a hermetic seal and, methods to create the same are disclosed. The hermetic seal includes an adhesive mixed with molecular sieves or zeolites. In one embodiment, the zeolites can include aluminosilicate-structured minerals such as sodium aluminosilicate. In another embodiment, the zeolites can include microporous silicate-structured minerals. It will be appreciated that active components other than zeolites that can act as absorbing filters on a molecular level can also be used. In one embodiment, the adhesive can include an adhesive with low outgassing numbers. In other embodiments, the adhesives can include adhesives with various outgassing numbers.

In one embodiment, the zeolites are mixed with the adhesive in a weight: ratio of 50:50. In other embodiments, the zeolites are mixed with the adhesive in various weight ratios. In one embodiment, the zeolites include zeolites in the powder form. In another embodiment, the zeolites include zeolites pellets. In yet another embodiment, the zeolites include zeolites beads.

The hermetic seal of the present invention can be applied as a bead between two surfaces to seal the two surfaces. The surfaces can include glass, metal, polymer, plastic, alloy or ceramic surfaces, or a combination thereof. The amount of bead that is applied can depend on the estimated amount of moisture or contaminant gases that will have to be removed from the package during the life of the package. This amount can be calculated by considering factors such as the amount of moisture/contamination that is present inside the package when the package is formed, the permeation rate of the adhesive, and the outgassing potential of the package components.

The zeolites can absorb water molecules at high temperatures. Zeolites of different pore sizes can be selected to absorb different contaminants. In one embodiment, the zeolites are selected to absorb contaminant molecules such as aromatic branched-chain hydrocarbons that have critical diameters of up to ten angstroms. In another embodiment, zeolites of pore sizes between two and three angstroms can be selected to absorb molecules of diameters less than two angstroms, namely hydrogen and moisture molecules. In yet another embodiment, zeolites of pore sizes of fifty angstroms are used to absorb nitrogen and carbon dioxide. molecules. In yet another embodiment, the hermetic seal can include a mixture of zeolites of various pore sizes.

The hermetic seal of the present invention can be constructed in a simple manner without using techniques such as welding and soldering, or by using o-rings. The bead can be applied through a simple in-line manufacturing process. The bead occupies a negligible amount of real estate and it does not significantly bulk up the package. The hermetic seal includes active components in the form of zeolites that can trap the moisture and other contaminant gases in their pores. The hermetic seal provides mechanical support to the MEMS based device package.

FIG. 1 illustrates an exemplary embodiment of package components that can be sealed with the hermetic seal of the present invention. The components 100 for the MEMS based device in the form of a flat panel display are shown. The components include the substrate glass 110, the mirror 120, the hermetic seal bead 130 and the back plate glass 140. The mirror 120 is processed on the substrate glass 110. The bead 130 is applied to the substrate glass 110 around the perimeter of the mirror 120. The back plate glass 140 is placed on top of the substrate glass 110. The substrate glass 110 and the back plate glass 140 are sealed together by the bead 130 to form the package 100. In the ensuing description, the terms components 100 and package 100 are used interchangeably. Also, in the ensuing description, the terms bead 130 and hermetic seal 130 are used interchangeably.

The mirror 120 can be referred to as the MEMS based device or the MEMS structure. The package 100 can also be referred to as the glass sandwich. The package 100 formed by the components 100 can be a component of a flat panel display. An array of mirrors such as the mirror 120 can be processed on the substrate glass 110 to form the flat panel display. The back plate glass 140 serves as the viewing surface. The back plate glass 140 also serves a mechanical function because it prevents the user from touching the mirror 110.

The mirror 120 can be processed through conventional semiconductor technology processes. The mirror 120 can include a metallic mirror such as an aluminum mirror. It will be appreciated that in addition to the mirror 120, the package can include other display elements. It will be appreciated that clear plastic surfaces can replace the substrate glass 110 and the back plate glass 140.

The bead 130 can be applied around the perimeter of the mirror 120. For the embodiments in which the substrate glass 110 includes a plurality of mirrors [130] *120*, the bead 130 can be applied around the perimeter of the plurality of mirrors 120. In one embodiment, the bead 130 thickness is one hundred angstroms. In another embodiment, the bead 130 thickness is two hundred angstroms. In yet another embodiment, the bead 130 thickness is three hundred angstroms. In still other embodiments, beads 130 of various thicknesses that maintain a low form factor for the package 100 can be applied.

It will be appreciated that the application of the hermetic seal 130 of the present invention is not limited to the MEMS based products. The hermetic seal 130 can seal various surfaces of various devices and products. The hermetic seal 130 can seal surfaces including metals, plastics, polymers, ceramics, alloys and the like. The hermetic seal 130 of the present invention is ideal for the space critical environments because it occupies negligible real estate. The prior art seals that are formed by using techniques such as welding and soldering or by using o-rings can substantially bulk up the size of the package 100. The hermetic seal 130 can be applied through simple in-line manufacturing processes. The prior art techniques of welding and soldering require very high temperature processes that are expensive, can damage the package, and occupy valuable real estate.

The hermetic seal 130 acts as an environmental barrier by blocking humidity and chemical contaminants from entering the package 100. The hermetic seal 130 includes an adhesive mixed with an active component such as the zeolites. The adhesive alone, even a low permeation rate adhesive, cannot serve as a perfect environmental barrier because it eventually allows the contaminants and moisture to permeate. The active component can grab the contaminants and moisture that try to permeate into the package 100, instead of merely blocking their entry. The active component can grab the contaminant gases that result from outgassing of the components 100 after the package 100 is formed. The active component can grab the portion of the adhesive that evaporates into the package 100 while the adhesive is curing. The thickness of the bead 130 and the amount of active component that is mixed with the adhesive can depend on the package 100 estimated life time and the estimated amount of contaminants and moisture that can penetrate the package 100 during the expected life time.

In some embodiments, an outer bead 150 of adhesive is applied around the perimeter of the bead 130. The outer bead 150 can include a low permeation rate adhesive. The outer bead 150 can provide additional environmental protection to the package 100. The outer bead can be useful for the aggressive environment in which the bead 130 alone cannot serve as an effective hermetic seal without being loaded with an impractical amount of the active component. If the bead 130 includes a very high portion of zeolites in the zeolites-adhesive mixture, for example more than sixty percent zeolites by weight, the bead 130 can become microscopically porous. The bead 130 can also become highly non-viscous and thus difficult to apply. Also, the bead 130 with a high percentage of zeolite by weight may not provide a robust mechanical support to the package 100. In aggressive environments, the application of the outer bead 150 can slow down the penetration process of contaminants and moisture into the package 100.

In the foregoing specification, the invention has been described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A micro-electromechanical systems [based] device [package] comprising:

a back plate glass;

a substrate glass;

*at least one mirror located between the substrate glass and the back plate glass; the at lease one mirror being configured to be actuated in an electronic display; and*

[a bead of] an adhesive mixed with a zeolite*, the adhesive* applied between the back plate glass and the substrate glass[; and], *wherein the adhesive is applied substantially around the outer perimeter of the at least one mirror.*

[a mirror processed on the substrate glass.]

[2. The micro-electromechanical systems based device package of claim 1, including the bead being applied around the perimeter of the mirror.]

3. The micro-electromechanical systems [based] device [package] of claim 1, wherein the [bead] *adhesive* acts as a hermetic seal.

4. The micro-electromechanical systems [based] device [package] of claim 1, wherein the [bead] *adhesive* traps moisture and other contaminant gases that can be harmful to the mirror.

[5. The micro-electromechanical systems based device package of claim 1, wherein the micro-electromechanical systems device includes an electronic display screen.]

6. A micro-electromechanical systems [based] (*MEMS*) device [package] comprising:

a back plate glass;

a substrate glass;

*at least one MEMS structure located between the substrate glass and the back plate glass;* and

[a bead of] an adhesive mixed with zeolites of different pore sizes, *the adhesive* applied between the back plate glass and the substrate glass, wherein the zeolites of different pore sizes are selected to absorb molecules of different diameters, *wherein the adhesive is applied substantially around the outer perimeter of the at least one MEMS structure.*

7. The micro-electromechanical systems [based] device [package] of claim 6, wherein some of the zeolites have a pore size to allow absorption of molecules having a diameter of up to ten angstroms.

8. The micro-electromechanical systems [based] device [package] of claim 6, wherein some of the zeolites have a pore size to allow absorption of molecules having a diameter of less than two angstroms.

9. The micro-electromechanical systems [based] device [package] of claim 6, wherein the pore sizes of some of the zeolites allow absorption of nitrogen and carbon dioxide molecules.

10. A micro-electromechanical systems [based] (*MEMS*) device [package] comprising:

a back plate glass;

a substrate glass;

*at least one MEMS structure located between the substrate glass and the back plate glass, the at least one MEMS structure being configured to be actuated;* and

[a bead of] an adhesive mixed with a zeolite, *the adhesive* applied between the back plate glass and the substrate glass, wherein the zeolite is selected to have a pore size which allows the zeolite to absorb a contaminant gas that is outgassed by [components of the package] *the at least one MEMS structure*, and wherein said pore size is up to *about* fifty Angstroms, *wherein the adhesive is supplied substantially around the outer perimeter of the at least one MEMS structure.*

11. The micro-electromechanical systems [based] device [package] of claim 10, wherein the zeolite has a pore size that allows it to absorb aromatic branched-chain hydrocarbons.

12. The micro-electromechanical systems [based] device [package] of claim 10, wherein the zeolite has a pore size that allows it to absorb hydrogen molecules.

13. The micro-electromechanical systems [based] device [package] of claim 10, wherein the zeolite has a pore size that allows it to absorb nitrogen and carbon dioxide molecules.

*14. A micro-electromechanical systems (MEMS) device, comprising:*

*a back plate;*

*a substrate;*

*at least one reflective MEMS device located between the substrate glass and the back plate glass; and*

*an adhesive mixed with a zeolite, the adhesive applied between the back plate and the substrate, wherein the zeolite is selected to absorb contaminant molecules outgassed by the at least one MEMS device, said contaminant molecules having a diameter of up to about ten angstroms, and wherein the adhesive is applied substantially around the outer perimeter of the at least one MEMS device.*

*15. The micro-electromechanical systems device of claim 14, wherein the zeolite is selected to absorb molecules having a diameter less than about two angstroms.*

*16. The micro-electromechanical systems device of claim 14, wherein the zeolite is selected to have a pore size between about two and three angstroms.*

*17. The micro-electromechanical systems device of claim 14, wherein the zeolite is selected to absorb aromatic branched-chain hydrocarbons.*

*18. The micro-electromechanical systems device of claim 14, wherein the zeolite is selected to absorb hydrogen molecules.*

*19. The micro-electromechanical systems device of claim 14, wherein the zeolite is selected to absorb moisture molecules.*

*20. A micro-electromechanical systems device, comprising:*

*a back plate;*

*a substrate;*

*at least one mirror located between the substrate and the back plate, the at least one mirror being configured to be actuated; and*

*an adhesive mixed with a zeolite, the adhesive applied between the back plate and the substrate, wherein the zeolite is selected to have a pore size of about fifty angstroms, and wherein the adhesive is applied substantially around the outer perimeter of the at least one mirror.*

*21. The micro-electromechanical systems device of claim 20, wherein the zeolite is selected to absorb nitrogen.*

*22. The micro-electromechanical systems device of claim 20, wherein the zeolite is selected to absorb carbon dioxide.*

*23. The micro-electromechanical systems device of claim 1, wherein the adhesive is applied as a bead between the back plate glass and the substrate glass.*

*24. The micro-electromechanical systems device of claim 6, wherein the adhesive is applied as a bead between the back plate glass and the substrate glass.*

*25. The micro-electromechanical systems device of claim 6, wherein the adhesive acts as a hermetic seal.*

*26. The micro-electromechanical systems device of claim 10, wherein the adhesive is applied as a bead between the back plate glass and the substrate glass.*

*27. The micro-electromechanical systems device of claim 10, wherein the adhesive acts as a hermetic seal.*

*28. The micro-electromechanical systems device of claim 1, wherein the at least one mirror comprises a plurality of mirrors, and wherein the adhesive is applied substantially around the perimeter of the plurality of mirrors.*

* * * * *